United States Patent [19]

Eyer et al.

[11] Patent Number: 4,690,797
[45] Date of Patent: Sep. 1, 1987

[54] METHOD FOR THE MANUFACTURE OF LARGE AREA SILICON CRYSTAL BODIES FOR SOLAR CELLS

[75] Inventors: Achim Eyer, Freiburg/Breisgau; Armin Raeuber, Gundelfingen; Norbert Schillinger, Ihringen, all of Fed. Rep. of Germany

[73] Assignee: Siemens Aktiengesellschaft, Berlin and Munich, Fed. Rep. of Germany

[21] Appl. No.: 908,165

[22] Filed: Sep. 17, 1986

[30] Foreign Application Priority Data

Oct. 15, 1985 [DE] Fed. Rep. of Germany ....... 3536743

[51] Int. Cl.[4] .................................................. B22F 1/00
[52] U.S. Cl. .......................................... 419/23; 419/29; 419/38; 419/53; 419/54; 419/55; 156/603; 156/DIG. 64; 156/DIG. 88; 264/61; 264/125; 264/332; 23/295 S
[58] Field of Search ....................... 419/23, 29, 38, 53, 419/54, 55; 156/603, DIG. 64, DIG. 88; 264/61, 125, 332; 23/295 S

[56] References Cited

U.S. PATENT DOCUMENTS

| | | | |
|---|---|---|---|
| 4,090,851 | 5/1978 | Berkman et al. | 156/DIG. 88 |
| 4,099,924 | 7/1978 | Berkman et al. | 156/DIG. 88 |
| 4,330,358 | 5/1982 | Grabmaier et al. | 156/603 |
| 4,357,201 | 11/1982 | Grabmaier et al. | 156/605 |
| 4,486,265 | 12/1984 | Little | 156/610 |
| 4,599,245 | 7/1986 | Falckenberg et al. | 427/74 |
| 4,643,797 | 2/1987 | Grabmaier et al. | 156/DIG. 88 |

FOREIGN PATENT DOCUMENTS 3017923 11/1981 Fed. Rep. of Germany .

*Primary Examiner*—Stephen J. Lechert, Jr.
*Attorney, Agent, or Firm*—Hill, Van Santen, Steadman & Simpson

[57] ABSTRACT

A method for the manufacture of large area silicon crystal bodies suitable for use in the manufacture of solar cells wherein silicon powder having a small grain size is used as the starting material. This powder is compressed to form a thin layer in a suitable form, the form having at least a surface composed of silicon or a silicon compound. The form is filled to a depth approximating the final dimensions of the article. The powder is sintered in the form, and the compressed, sintered layer is converted into a self-supporting silicon foil. This foil is melted partially up to at least half its thickness and recrystallized in a two-stage temperature treatment. The melting occurs by means of a single-sided energy irradiation. The silicon foil is not deteriorated in terms of its mechanical stability and shaped by means of the single-sided, optical type heating. The larger grains which arise in the first melting and recrystallization are used to continue growth over the full layer thickness of the silicon body during the second melting and recrystallization. This produces silicon bodies for solar cells which can be economically manufactured and can be manufactured with high purity and crystal quality.

10 Claims, 7 Drawing Figures

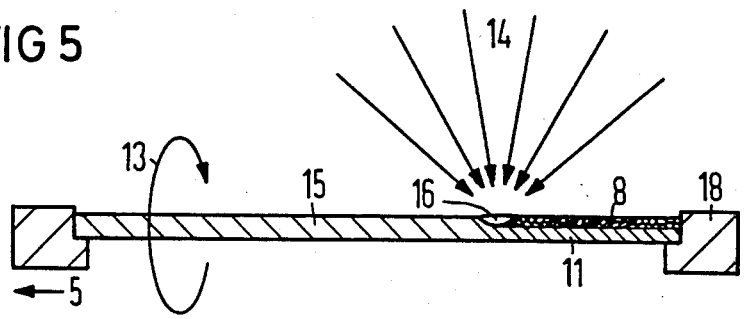
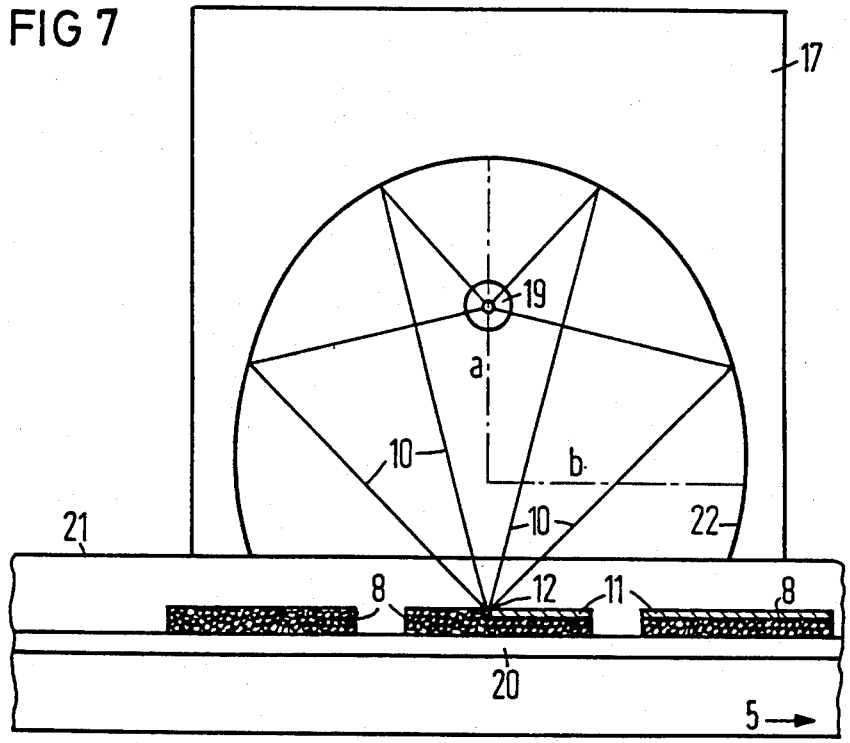

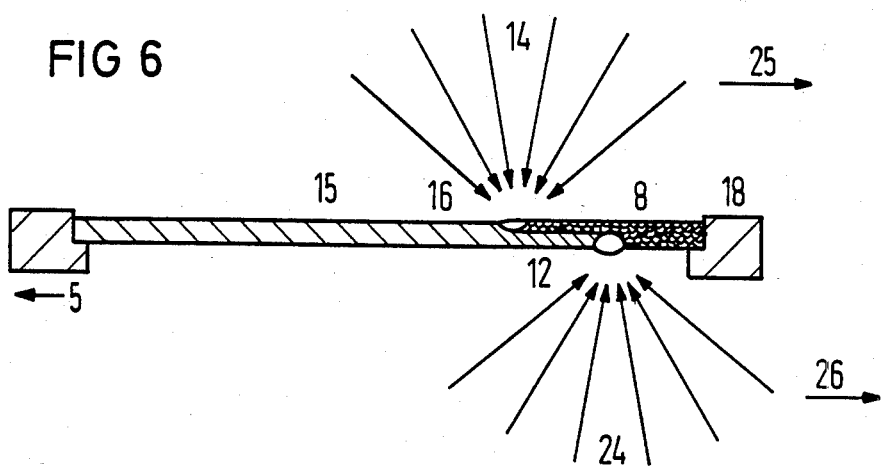

METHOD FOR THE MANUFACTURE OF LARGE AREA SILICON CRYSTAL BODIES FOR SOLAR CELLS

BACKGROUND OF THE INVENTION

1. Field of the Invention

The present invention relates to a method for the manufacture of large area silicon crystal bodies for solar cells, utilizing silicon powder of a small crystal grain size as the starting material, and converting the same into the form of a foil by means of a sintering process.

2. Description of the Prior Art

A method similar to the one described is known from German OS No. 29 27 086 (U.S. Pat. No. 4,330,358). In this method, a silicon foil is produced by combining a silicon powder with an organic binder to form a slip and the slip is drawn out onto a substrate. The slip is sintered in an argon gas atmosphere at 1350° C., whereby the silicon grains of less than 1 micron diameter grow to grains having a diameter greater than the foil thickness. The sintering temperature is selected so as to be as close as possible to the melting temperature and the sintering is continued until an adequate grain growth has occurred.

The grain growth and the shrinkage, however, are greatly impeded by the oxide skin which surrounds each silicon grain. A satisfactory shrinkage can only occur where a melting process has occurred. In a long-term sintering, melting must be avoided because of the reaction with the substrate.

German OS No. 30 17 923A 1 discloses a method for the manufacture of a silicon foil in which, during the sintering process, the silicon foil is briefly melted at its surface region with one or more heat pulses. The heat is generated by means of a hot air stream and the non-melted underside of the sintered silicon foil is removed. This method is relatively complicated and, due to the removal of the back side of the film, is not well suited for the manufacture of economical solar cell base materials because of the material loss and because of the reduced yield resulting therefrom. Moreover, a continuous fabrication process based on this technique is difficult to implement.

SUMMARY OF THE INVENTION

The present invention provides a method for the manufacture of large area silicon crystal bodies for solar cells which does not have the above noted deficiencies. The method of the present invention is such that no contamination is provided into the crystal bodies during the sintering and melting process, as contamination potentially deteriorates the crystal quality and the electrical properties of the solar cells manufactured of this material.

In accordance with the present invention, the silicon powder is compressed by pressing it in a form composed of silicon or of a silicon compound, at least in the surface which contacts the silicon powder. The dimensions of the form are substantially those of the crystal bodies to be manufactured, the silicon powder being compressed within the form to a thickness approximating that of the final product.

The compressed layer is then converted into a self-supporting silicon foil by sintering at a first elevated temperature. The sintering silicon foil is then melted up to at least one-half of its layer thickness, but less than its complete thickness, in a second elevated temperature treatment utilizing single-sided energy irradiation, after which the silicon crystals are recrystallized. The remaining layer thickness is then melted and recrystallized in a third elevated temperature treatment so that the enlarged crystal grains produced in the recrystallization following the second temperature treatment continue to grow over the entire layer thickness of the silicon body.

The preferred method of temperature treatment consists of the utilization of single-sided, optical heating preferably by means of series-connected, focused radiation sources.

In specific embodiments of the present invention, the starting material, the finely divided silicon powder, has a grain size which has a maximum of 200 microns. The layer thickness of the sintered foil is preferably in the range from 300 to 1000 microns. The sintering process of the silicon grains is carried out at 1350° to 1400° C., at a period of time in the neighborhood of one minute.

In a preferred form of the invention, the silicon body is inverted between the second and third high temperature treatments.

The method is preferably carried out through the use of halogen lamps as the radiation sources, the radiation being focused by means of cylindrical mirrors which have an elliptical cross section and a reflectivity of at least 85%.

Although German OS No. 33 38 335A1 discloses a method for the manufacture of large area silicon crystal bodies for solar cells wherein sintered silicon bodies are melted in self-supporting fashion to produce a relatively high purity of crystal quality, the sintered silicon foil herein is melted entirely through in one temperature step. The sintered silicon foil is moved according to assembly line techniques through a horizontal heater arrangement on a carrier member, for example, a fiber glass fabric, which is not wettable or is only poorly wettable by molten silicon. The carrier member is removed after the crystallization. Specially designed heaters are used so that the solidification of the planar silicon crystal body ensues from the center toward the outside. However, in this method, the self-supporting sintered silicon foil at least temporarily loses its mechanical stability and the grain growth becomes irregular. Moreover, the risk of encountering contaminations from the carrier member as well as the melting of the foil are present.

In the present invention, by contrast, entrainment of contaminants is avoided from the very beginning basically by the fact that the compression occurs without a binding agent being present and the sintering is only carried out for the purpose of the mechanical stability of the foil, being carried out on a cold substrate composed of a material of silicon or a silicon compound. When a reaction chamber of quartz is employed, the quartz remains relatively cold in the high temperature treatments. The grain growth in the method of the present invention can occur uniformly since only about one-half the layer thickness is initially melted and the remaining layer thickness is not melted and recrystallized until after the recrystallization of this part of the layer. Since the substrate remains relatively cold in both melting processes by the use of single-sided energy irradiation, an adhesion or fusing of the foil to the substrate is also avoided.

In accordance with the present invention, the self-supporting sintered silicon foil is first melted down from above to a desired depth which may constitute at least one-half of its thickness at temperatures in the range of 1420° to 1480° C., and is recrystallized in coarse grains. The non-melted layer part of the foil supplies mechanical stability required for the melting and recrystallization process. The foil is then melted from its back side at temperatures in the range of 1420° to 1480° C. whereby the stability in the last melting process is guaranteed by the upper part which has already been recrystallized. The coarse grains of the upper layer part which have already been formed thereby form the starting point for further growth.

Very thin and smooth silicon crystal sheets or tapes as well can be manufactured in a given size in the simplest possible way on the basis of the method of the present invention, being likewise manufactured using assembly line techniques. The efficiency reaches values of at least 10%.

The planar silicon manufactured in accordance with the invention can also be utilized to advantage as an economical silicon substrate material for the manufacture of semiconductor components.

BRIEF DESCRIPTION OF THE DRAWINGS

A further description of the present invention will be made in connection with the attached sheets of drawings in which:

FIGS. 1 through 6 are greatly enlarged cross-sectional views illustrating the fabrication steps used in accordance with the present invention; and FIG. 7 is a schematic illustration of an arrangement for irradiating the sintered silicon foils on a continuous basis.

DESCRIPTION OF THE PREFERRED EMBODIMENTS

Figure 1:
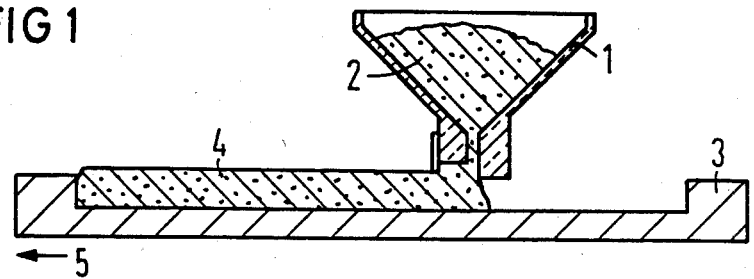

As shown in FIG. 1, silicon powder 2 having a grain size, for example, in the range from 80 to 150 microns is introduced from a funnel-shaped reservoir 1 composed of quartz or the like in to a form 3 composed, for example of silicon, the depth of the form being on the order of 1500 microns. For example, the area of the powdered layer 4 may amount to 50 mm × 100 mm. The direction of movement of the silicon form 3 is indicated by the arrow 5.

Figure 2:
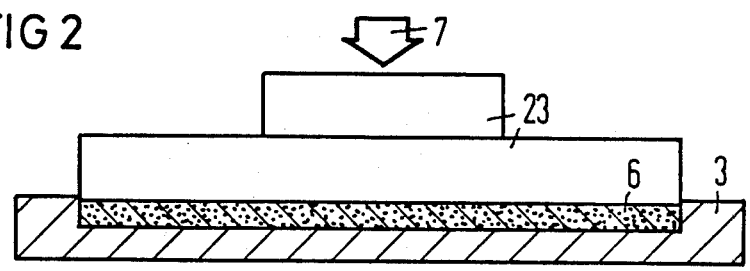

In FIG. 2, the layer 4 of silicon particles in the form 3 is composed by means of a die 23 consisting of a punch coated with silicon carbide, using a pressure on the order of 4kN/cm². The arrow 7 indicates the direction of pressure. The compressed silicon powder layer is identified at reference numeral 6.

Figure 3:
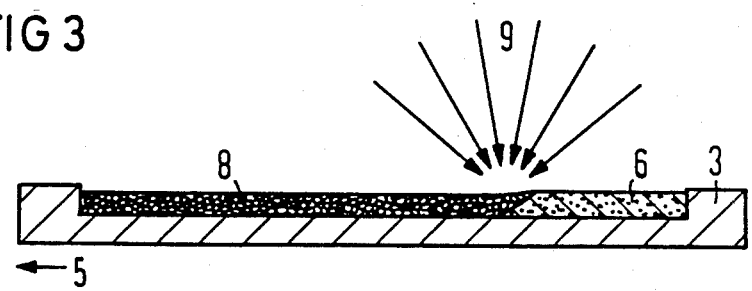

FIG. 3 shows the manufacture of a self-supporting sintered silicon foil 8 having a thickness of about 1000 microns from the compressed film 6 by sintering at a temperature of 1350° to 1400° C. The sintering occurs by means of focused radiation illustrated by the arrows 9, which radiation will be described more completely in conjunction with FIG. 7. The arrow 5 again indicates the direction of movement of the form 3 which is charged with the compressed powder or the sintered foil 8. The speed may be on the order of 10 mm per minute. The process and the following process are carried out in a reaction chamber (not shown in FIGS. 3-6) filled with argon gas.

Figure 4:
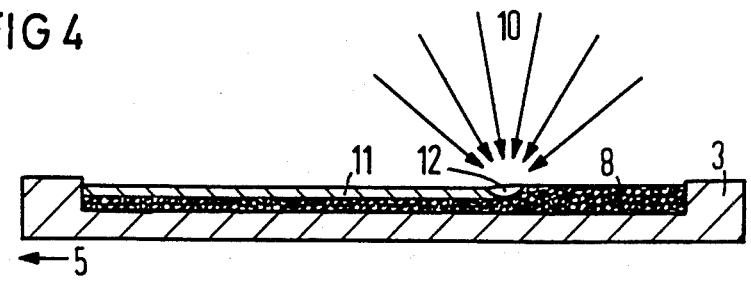

The first surface melting process is then carried out as illustrated under FIG. 4. The sintered silicon foil 8 is melted at temperatures in the range of 1420° to 1480° C. to less than its entire thickness but up to at least one-half of its thickness (preferably up to two-thirds of its thickness) by means of a single-sided optical irradiation indicated by the arrows 10 having a higher power or energy than the radiation source 9 shown in FIG. 3. The supernatant layer of silicon is thus melted and allowed to recrystallize. The recrystallized layer is referred to at reference numeral 11 and the melting zone, having a width of about 8 mm, is identified at reference numeral 12. The grain size of the recrystallized layer 11 amounts to about 500 microns.

In FIG. 5, the arrow 13 indicates that the structure shown in FIG. 4 has been inverted, and a second surface melting process takes place. The remaining layer thickness of the sintered foil 8 is melted and recrystallized. The heating is carried out with a focused radiation source 14 of identical intensity as the radiation source 10 shown in FIG. 4. A coarse-grained layer 11 which arose in the recrystallization step of FIG. 4 now serves as a nucleation layer for the recrystallization wherein the grain growth occurs up to the full layer thickness. The finished, coarse-crystalline silicon body 15 is thus produced. The melting zone having a width of about 8 mm is referred to at reference numeral 16. The arrow 5 illustrates the direction of movement. The speed is matched to the speed of the sintering process shown in FIG. 3 and in the first melting process shown in FIG. 4. In this way, the method of the present invention can be very well employed for continuous operation on an assembly line basis.

When an additional radiation source 24 is arranged below the sintered silicon body 8, as shown in FIG. 6, the inversion of the piece shown at the arrow 13 in FIG. 5 can be eliminated. The first and the second melting process are then carried out simultaneously but shifted against each other as indicated by the positions of the melting zones 12 and 16 in FIG. 6. However, the silicon body 8, must then be held at its edges in the open form 18 as shown in FIG. 6. Instead of moving form 18 also the radiation sources 14 and 24 can be moved as indicated by arrows 25 and 26.

The first melting and recrystallization process shown schematically in FIG. 4 is set forth in greater detail with reference to FIG. 7. For the sake of simplicity, the sintered silicon foils 8 and 11 are shown without their holding devices 3. By means a cylindrical mirror 17 having an elliptical cross section as shown in FIG. 7, the radiation shown at lines 10 is projected from a rod-shaped halogen lamp 19 having a power of up to 6 kW. The energy is focused onto the sintered silicon foils 8 which are located on a conveyor belt 20 and passed through a quartz reactor 21 while supported in the forms 3. During the process, the reactor 21 is filled with a protective atmosphere composed of argon gas. The halogen rod lamp 19 employed has an incandescent wire length of 230 mm. For optimum use of the radiation 10, the width of the silicon foil 8 can amount to about 200 mm. In order to obtain an optimum efficiency of the radiation arrangement 17, 19, the reflector mirror 17 is designed with respect to its reflection face 22 such that the cross-sectional ellipse comprises semiaxes a and b of 70 mm and 60 mm, respectively. The reflection face 22 should preferably extend into the region of the plane of the silicon body surface 8, 11.

It will be understood that various modifications can be made to the described embodiments without departing from the scope of the present invention.

We claim as our invention:

1. A method for the manufacture of large area silicon crystal bodies suitable for the manufacture of solar cells which comprises:
   (a) compressing finely divided silicon powder particles into a layer of larger thickness than said particles, the compressing taking place in a form composed of silicon or a silicon compound,
   (b) sintering the compressed layer into a self-supporting silicon foil at a first elevated temperature,
   (c) irradiating the sintered silicon foil with a single-sided energy irradiation in a radiation zone to melt the foil up to at least one-half its thickness at a second elevated temperature,
   (d) recrystallizing the melted portion of said foil,
   (e) melting the remaining previously unmelted layer portion at a third elevated temperature, and
   (f) recrystallizing the newly melted layer portion, the conditions being such that the recrystallized grains produced after treatment at said second elevated temperature continue to grow over the entire layer thickness of the silicon body.

2. A method according to claim 1 wherein the treatment at each of said elevated temperatures results from single-sided optical heating.

3. A method according to claim 2 wherein said optical heating results from a plurality of focused radiation sources in series.

4. A method according to claim 1 wherein said silicon powder particles have a particle size not in excess of 200 microns.

5. A method according to claim 4 wherein the thickness of said layer of sintered silicon foil is in the range of 300 to 1000 microns.

6. A method according to claim 1 wherein said first elevated temperature is in the range from 1350° to 1400°C.

7. A method according to claim 1 which includes the steps of:
   conveying the sintered silicon foil continuously through said irradiation zone generated by two energy sources arranged above and one arranged below the conveyor belt or inverting the silicon foil between the treatments at the second and third elevated temperatures when all three energy sources are arranged above.

8. A method according to claim 3 wherein the radiation sources are moved and the silicon foils maintain stationary.

9. A method according to claim 3 wherein said radiation sources are halogen lamps, and the focusing of said radiation occurs by means of cylindrical mirrors having an elliptical cross section.

10. A method according to claim 9 wherein the reflector faces of said mirrors extends into the region of the plane of the silicon body surfaces.

* * * * *